United States Patent [19]
Jinbo et al.

[11] Patent Number: 5,587,648
[45] Date of Patent: Dec. 24, 1996

[54] POWER SUPPLY CIRCUIT FOR GENERATING AN INTERNAL POWER SUPPLY POTENTIAL BASED ON AN EXTERNAL POTENTIAL

[75] Inventors: Shinichi Jinbo; Shigeru Mori, both of Hyogo, Japan

[73] Assignee: Mitsubishi Denki Kabushiki Kaisha, Tokyo, Japan

[21] Appl. No.: 378,217

[22] Filed: Jan. 25, 1995

[30] Foreign Application Priority Data

Jan. 31, 1994 [JP] Japan ................................. 6-009136

[51] Int. Cl.⁶ .................................................. G05F 1/613
[52] U.S. Cl. ........................................ 323/269; 323/274
[58] Field of Search ................................. 323/267, 269, 323/273, 274, 349, 350; 363/65; 307/82

[56] References Cited

U.S. PATENT DOCUMENTS

| | | | |
|---|---|---|---|
| 4,644,251 | 2/1987 | Rathke | 323/267 |
| 5,455,501 | 10/1995 | Massie | 323/267 |
| 5,479,087 | 12/1995 | Wright | 323/267 |

FOREIGN PATENT DOCUMENTS 3923632  11/1990  Germany .................. G11C 5/14

OTHER PUBLICATIONS

Koichiro Ishibashi, et al, "A Voltage Down Converter with Submicroampere Standby Current for Low–Power Static RAM's", IEEE Journal of Solid–State Circuits, vol. 27, No. 6, Jun. 1992, pp. 920–926.

Primary Examiner—Jeffrey L. Sterrett
Attorney, Agent, or Firm—Lowe, Price, LeBlanc & Becker

[57] ABSTRACT

An internal power supply circuit of the present invention includes a primary internal power supply potential supplying circuit, two auxiliary internal power supply potential supplying circuits, and a P channel MOS transistor. The internal power supply potential supplying circuit always supplies an internal power supply potential to a first output node based on an external power supply potential. One auxiliary internal power supply potential supplying circuit is activated in response to a control signal, and, when activated, supplies the internal power supply potential to the first output node. The other auxiliary internal power supply potential supplying circuit is activated in response to another control signal, and, when activated, supplies the internal power supply potential to a second output node. The P channel MOS transistor is connected between the first output node and the second output node. The P channel MOS transistor has a gate electrode receiving the control signal.

14 Claims, 5 Drawing Sheets

POWER SUPPLY CIRCUIT FOR GENERATING AN INTERNAL POWER SUPPLY POTENTIAL BASED ON AN EXTERNAL POTENTIAL

BACKGROUND OF THE INVENTION

1. Field of the Invention

The present invention generally relates to internal power supply circuits, and more particularly, to an improvement of an internal power supply circuit generating an internal power supply potential based on an external power supply potential for an internal circuit in a semiconductor memory device.

2. Description of the Background Art

With recent progress of miniaturization of a semiconductor integrated circuit device, an internal power supply potential (for example, 3 V) lower than an external power supply potential (for example 5 V) is supplied to its internal circuit. In such a semiconductor integrated circuit device, only when the internal circuit is activated, current required for the internal circuit is supplied in order to reduce power consumption. More specifically, when the internal circuit is not activated, only current required for a stand-by state is supplied.

FIG. 8 is a block diagram showing a conventional internal power supply circuit supplying an internal power supply potential to a sense amplifier driving circuit and its peripheral circuit of a dynamic random access memory Referring to FIG. 8, an internal power supply circuit 1 includes an output node 2 connected to a power supply node of the peripheral circuit, an output node 3 connected to a power supply node of the sense amplifier driving circuit, a down converter 4 for the peripheral circuit generating an internal power supply potential intVcc based on an external power supply potential extVcc, and a down converter 5 for the sense amplifier driving circuit generating the internal power supply potential intVcc based on the external power supply potential extVcc.

Down converter 4 includes a primary internal power supply potential supplying circuit 6 and an auxiliary internal power supply potential supplying circuit 7. Primary internal power supply potential supplying circuit 6 supplies, based on the external power supply potential extVcc, the internal power supply potential intVcc lower than the same to output node 2. Auxiliary internal power supply potential supplying circuit 7 is activated in response to a control signal φ1, and, when activated, supplies the internal power supply potential intVcc to output node 2 based on the external power supply potential extVcc.

Similar to down converter 4, down converter 5 includes a primary internal power supply potential supplying circuit 8, and an auxiliary internal power supply potential supplying circuit 9. Similar to primary internal power supply potential supplying circuit 6, primary internal power supply potential supplying circuit 8 supplies the internal power supply potential to output node 3 based on the external power supply potential extVcc. Similar to auxiliary internal power supply potential supplying circuit 7, auxiliary internal power supply potential supplying circuit 9 is activated in response to a control signal φ2, and, when activated, supplies the internal power supply potential intVcc to output node 3 based on the external power supply potential extVcc.

Description will now be given of operation of internal power supply circuit 1.

In a stand-by state, the control signals φ1 and φ2 both at an L level are applied to auxiliary internal power supply potential supplying circuits 7 and 9, respectively. The L level denotes a low logic level.

When the control signals φ1 and φ2 at the L level are applied, auxiliary internal power supply potential supplying circuits 7 and 9 do not generate the internal power supply potential intVcc. On the other hand, primary internal power supply potential supplying circuits 6 and 8 always generate the internal power supply potential intVcc independent of the control signals φ1 and φ2.

Therefore, in the stand-by state, the internal power supply potential intVcc is supplied to the peripheral circuit through output node 2 only by primary internal power supply potential supplying circuit 6 in down converter 4. Since the peripheral circuit is in the stand-by state at this time, little power is consumed. Therefore, it is sufficient to have a driving ability of primary internal power supply potential supplying circuit 6 smaller than that of auxiliary internal power supply potential supplying circuit 7.

In the stand-by state, the internal power supply potential intVcc is supplied to the sense amplifier driving circuit through output node 3 only by primary internal power supply potential supplying circuit 8 in down converter 5. Since the sense amplifier driving circuit is in the stand-by state at this time, little power is consumed. Therefore, it is sufficient to have a driving ability of primary internal power supply potential supplying circuit 8 smaller than that of auxiliary internal power supply potential supplying circuit 9.

As described above, in the stand-by state, the internal power supply potential intVcc is supplied to the peripheral circuit through output node 2 by primary internal power supply potential supplying circuit 6 having a small driving ability, and to the sense amplifier driving circuit through output node 3 by primary internal power supply potential supplying circuit 8 having a small driving ability. Therefore, power consumed in the standby state becomes very small.

In an active state, in response to the falling of a row address strobe signal $\overline{RAS}$ (not shown), the internal circuit of the DRAM starts to operate. In response to the falling of the row address strobe signal $\overline{RAS}$, the control signals φ1 and φ2 rise from the L level to an H level. The H level denotes a high logic level. In response to the control signal φ1 at the H level, auxiliary internal power supply potential supplying circuit 7 is activated, causing the internal power supply potential intVcc to be supplied to the peripheral circuit through output node 2.

On the other hand, in response to the control signal φ2 at the H level, auxiliary internal power supply potential supplying circuit 9 is activated, causing the internal power supply potential intVcc to be supplied to the sense amplifier driving circuit through output node 3.

As described above, in the active state, the internal power supply potential intVcc is supplied to the peripheral circuit also by auxiliary internal power supply potential supplying circuit 7 having a large driving ability. Similarly, the internal power supply potential intVcc is supplied to the sense amplifier driving circuit also by auxiliary internal power supply potential supplying circuit 9 having a large driving ability. Therefore, the peripheral circuit and the sense amplifier driving circuit operate stably.

Since a number of sense amplifiers are driven in the active state, more power is consumed in the sense amplifier driving circuit than in the peripheral circuit. Therefore, upon driving of the sense amplifiers, the potential of output node 3 sometimes changes sharply. Since down converter 4 and down converter 5 are provided independently in internal power supply circuit 1, such a potential change of output node 3 as described above has no influence on output node 2.

Since two down converters 4 and 5 are provided in internal power supply circuit 1, however, power consumption becomes larger that the case where one down converter is provided.

SUMMARY OF THE INVENTION

One object of the present invention is to provide an internal power supply circuit of smaller power consumption.

Another object of the present invention is to provide an internal power supply circuit in which, even if a potential of one output node changes, a potential of the other output node will not change.

Still another object of the present invention is to provide an internal power supply circuit which can supply independently a stable internal power supply potential lower than an external power supply potential to a sense amplifier driving circuit and its peripheral circuit in a semiconductor memory device.

A further object of the present invention is to provide an internal power supply circuit which can supply independently a stable internal power supply potential higher than an external power supply potential to a word line driving circuit and a bit line selecting circuit in a shared sense amplifier system in a semiconductor memory device.

According to the present invention, an internal power supply circuit generating an internal power supply potential based on an external power supply potential includes a first output node, a second output node, a primary internal power supply potential supplying circuit, a first auxiliary internal power supply potential supplying circuit, a second auxiliary internal power supply potential supplying circuit, and a switching circuit. The primary internal power supply potential supplying circuit supplies the internal power supply potential to the first output node based on the external power supply potential. The first auxiliary internal power supply potential supplying circuit is activated in response to a first control signal, and, when activated, supplies the internal power supply potential to the first output node based on the external power supply potential. The second auxiliary internal power supply potential supplying circuit is activated in response to a second control signal in synchronism with the first control signal, and, when activated, supplies the internal power supply potential to the second output node based on the external power supply potential. Connected between the first and second output nodes, the switching circuit is rendered non-conductive in response to the first control signal and/or the second control signal.

Therefore, according to the present invention, the primary internal power supply potential supplying circuit supplies the internal power supply potential to the first output node, as well as to the second output node through the switching circuit in a stand-by state. Therefore, a first advantage of the present invention is that power consumption is reduced as compared to the case where two primary internal power supply potential supplying circuits supply the internal power supply potential to two output nodes, respectively.

According to the present invention, when the first auxiliary internal power supply potential supplying circuit supplies the internal power supply potential to the first output node, and the second auxiliary internal power supply potential supplying circuit supplies the internal power supply potential to the second output node in an active state, the switching circuit is rendered non-conductive. Therefore, a second advantage of the present invention is that a potential change at the first output node has no influence on the second output node, or a potential change at the second output node has no influence on the first output node.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
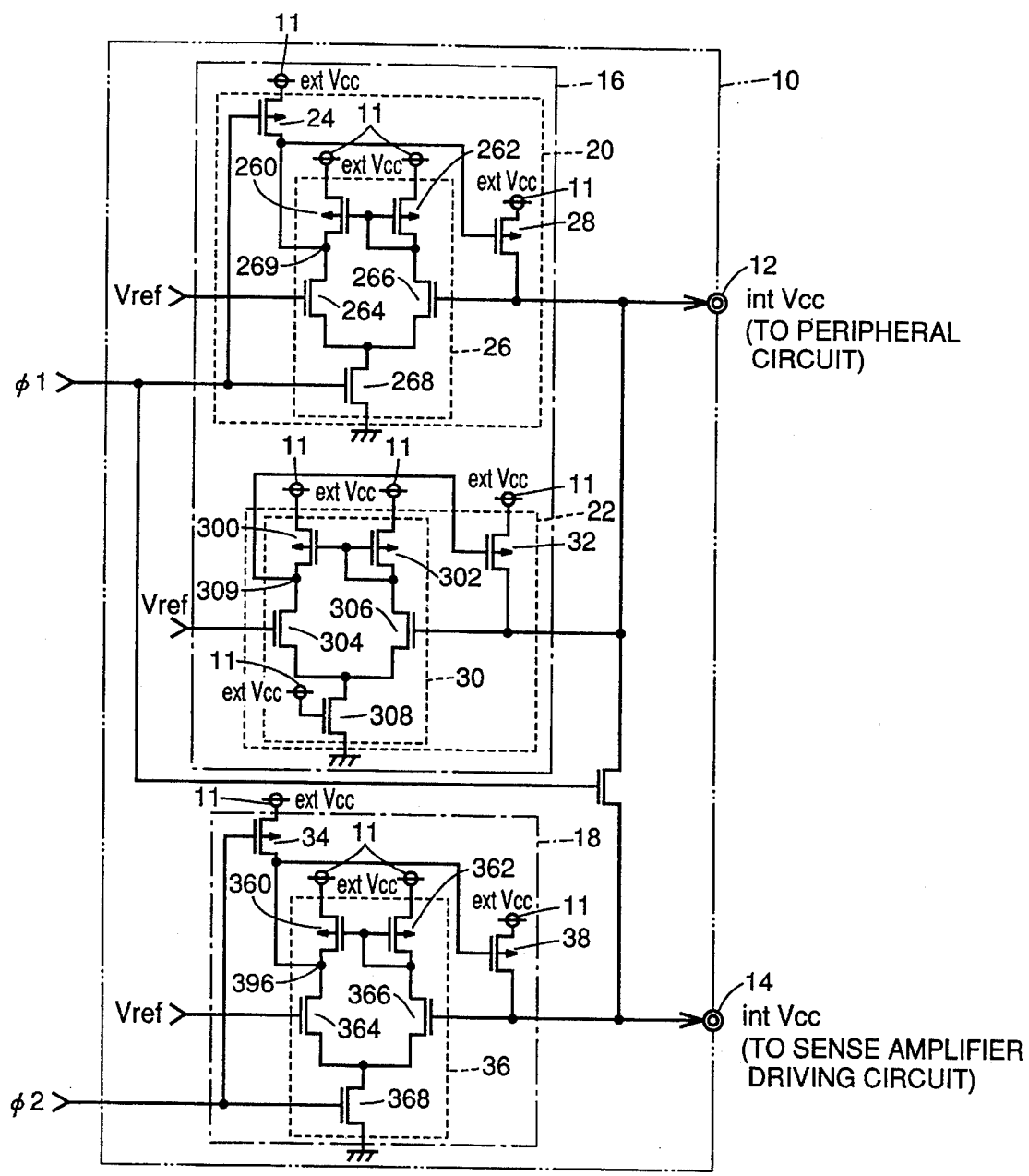
FIG. 1 is a circuit diagram showing the entire configuration of an internal power supply circuit according to Embodiment 1 of the present invention.

Detailed description will now be given of Embodiments of the present invention with reference to the drawings. In the figures, the same reference characters denote the same or corresponding portions.

EMBODIMENT 1

FIG. 1 is a circuit diagram showing the entire configuration of an internal power supply circuit according to Embodiment 1 of the present invention.

An internal power supply circuit 10 is formed in a DRAM (not shown). The DRAM includes a memory cell array having a plurality of memory cells arranged in a matrix of rows and columns, an address buffer generating an internal address signal in response to an external address signal, a row decoder decoding the internal address signal for selecting one row of the memory cell array, a sense amplifier amplifying data from memory cells in one row selected by the row decoder, a driving circuit driving the sense amplifier, a column decoder decoding the internal address signal for selecting one of a plurality of data amplified by the sense amplifier, and a data input/output buffer amplifying one of the data selected by the column decoder for output.

Based on an external power supply potential extVcc (for example, 5 V), internal power supply circuit 10 supplies an internal power supply potential intVcc (for example, 3 V) lower than the external power supply potential extVcc to the sense amplifier driving circuit and its peripheral circuit, independently. The peripheral circuit includes the row decoder, the column decoder, the address buffer, and the data input/output buffer.

Referring to FIG. 1, internal power supply circuit 10 includes an output node 12, an output node 14, a down converter 16 for the peripheral circuit, a down converter 18 for the sense amplifier, and a P channel MOS transistor 19.

Output node 12 is connected to respective power supply nodes of the row decoder, the column decoder, the address buffer, and the data input/output buffer. Output node 14 is connected to a power supply node of the sense amplifier driving circuit.

Down converter 16 is for supplying the internal power supply potential intVcc to the peripheral circuit such as the address buffer through output node 12. Down converter 18 is for supplying the internal power supply potential intVcc to the sense amplifier driving circuit through output node 14. P channel MOS transistor 19 is connected between output node 12 and output node 14.

Down converter 16 includes an auxiliary internal power supply potential supplying circuit 20, and a primary internal power supply potential supplying circuit 22. Auxiliary internal power supply potential supplying circuit 20 is activated in response to a control signal φ, and, when activated, supplies the internal power supply potential intVcc to output node 12 based on the external power supply potential extVcc. The control signal φ1, generated in response to an internal row address strobe signal $\overline{RAS}$, rises in response to the falling of the row address strobe signal. Primary internal power supply potential supplying circuit 22 always supplies the internal power supply potential intVcc to output node 12 based on the external power supply potential extVcc.

Down converter 18 configures an auxiliary internal power supply potential supplying circuit. Down converter 18 is activated in response to a control signal φ2, and, when activated, supplies the internal power supply potential intVcc to output node 14 based on the external power supply potential extVcc. The control signal φ2, generated in response to the internal row address strobe signal $\overline{RAS}$, rises in response to the falling of the row address strobe signal $\overline{RAS}$.

Auxiliary internal power supply potential supplying circuit 20 includes a P channel MOS transistor 24, a differential amplifier 26, and a driving P channel MOS transistor 28.

P channel MOS transistor 24 is connected between a power supply node 11 and the gate electrode of driving P channel MOS transistor 28. The control signal φ1 is applied to the gate electrode of transistor 24. Driving P channel MOS transistor 28 is connected between power supply node 11 and output node 12.

Differential amplifier 26 includes two P channel MOS transistors 260 and 262 configuring a current mirror circuit, an N channel MOS transistor 264 having a gate electrode to which a constant reference potential Vref is applied, an N channel MOS transistor 266 having a gate electrode to which the internal power supply potential intVcc is applied, and an N channel MOS transistor 268 having a gate electrode to which the control signal φ1 is applied, and supplying a constant current to transistors 260–266 in response to the control signal φ1 attaining the H level. An output node 269 of differential amplifier 26 is connected to the gate electrode of driving P channel MOS transistor 28.

Therefore, when the control signal φ1 attains the H level, differential amplifier 26 is activated, and P channel MOS transistor 24 is rendered non-conductive. When activated, differential amplifier 26 compares the internal power supply potential intVcc with the reference potential Vref, and controls driving P channel MOS transistor 28 according to the comparison result.

More specifically, when the internal power supply potential intVcc is lower than the reference potential Vref, the potential of output node 269 drops, and driving P channel MOS transistor 28 is rendered conductive. As a result, since charge is supplied from power supply node 11 to output node 12 through driving P channel MOS transistor 28, the internal power supply potential intVcc increases.

On the other hand, when the internal power supply potential intVcc is higher than the reference potential Vref, the potential of output node 269 increases, and driving P channel MOS transistor 28 is rendered non-conductive. As a result, charge is not supplied from power supply node 11 to output node 12 through driving P channel MOS transistor 28. Therefore, the internal power supply potential intVcc decreases.

Plainly speaking, differential amplifier 26 and driving P channel MOS transistor 28 are for controlling the internal power supply potential intVcc to be equal to the reference potential Vref.

Primary internal power supply potential supplying circuit 22 includes a differential amplifier 30, and a driving P channel MOS transistor 32.

Similar to differential amplifier 26, differential amplifier 30 includes two P channel MOS transistors 300 and 302 configuring a current mirror circuit, an N channel MOS transistor 304 having a gate electrode to which the reference potential Vref is applied, an N channel MOS transistor 306 having a gate electrode to which the internal power supply potential intVcc is applied, and an N channel MOS transistor 308 having a gate electrode to which the external power supply potential extVcc is applied, and supplying a constant current to transistors 300–306. An output node 309 of differential amplifier 30 is connected to the gate electrode of driving P channel MOS transistor 32. Driving P channel MOS transistor 32 is connected between power supply node 11 and output node 12.

Since the external power supply potential is always applied to the gate electrode of N channel MOS transistor 308, differential amplifier 30 is always activated unlike differential amplifier 26. Therefore, when the internal power supply potential intVcc is lower than the reference potential Vref, the potential of output node 309 drops, rendering driving P channel MOS transistor 32 conductive. When transistor 32 is rendered conductive, charge is supplied from power supply node 11 to output node 12 through driving P channel MOS transistor 32. Therefore, the internal power supply potential intVcc increases.

On the other hand, when the internal power supply potential intVcc is higher than the reference potential Vref, the potential of output node 309 increases, rendering driving P channel MOS transistor 32 non-conductive. Therefore, charge is not supplied from power supply node 11 to output node 12 through driving P channel MOS transistor 32, and the internal power supply potential intVcc decreases.

Plainly speaking, primary internal power supply potential supplying circuit 22 configured of differential amplifier 30 and driving MOS transistor 32 is for controlling the internal power supply potential intVcc to be always equal to the reference potential Vref.

Similar to auxiliary internal power supply potential supplying circuit 20, auxiliary internal power supply potential supplying circuit 18 includes a P channel MOS transistor 34, a differential amplifier 36, and a driving P channel MOS transistor 38.

P channel MOS transistor 34 is connected between power supply node 11 and the gate electrode of driving P channel MOS transistor 38. The control signal φ2 is applied to the gate electrode of transistor 34. Driving P channel MOS transistor 38 is connected between power supply node 11 and output node 14.

Differential amplifier 36 includes P channel MOS transistors 360 and 362 configuring a current mirror circuit, an N channel MOS transistor 364 having a gate electrode to which the reference potential Vref is applied, an N channel MOS transistor 366 having a gate electrode to which the internal power supply potential intVcc is applied, and an N channel MOS transistor 368 having a gate electrode to which the control signal φ2 is applied, and supplying a constant current to transistors 360–366 in response to the control signal φ2 attaining the H level. Output node 369 of differential amplifier 36 is connected to the gate electrode of driving P channel MOS transistor 38.

Therefore, in auxiliary internal power supply potential supplying circuit 18, in response to the control signal φ2 at the L level, P channel MOS transistor 34 is rendered conductive, and N channel MOS transistor 368 is rendered non-conductive as in auxiliary internal power supply potential supplying circuit 20. Since the external power supply potential extVcc is applied to the gate electrode of driving P channel MOS transistor 38 from power supply node 11 through P channel MOS transistor 34, driving P channel MOS transistor 38 is rendered non-conductive. Therefore, auxiliary internal power supply potential supplying circuit 18 does not function.

On the other hand, when the control signal φ2 at the H level is applied, P channel MOS transistor 34 is rendered non-conductive, and N channel MOS transistor 368 is rendered conductive. As a result, auxiliary internal power supply potential supplying circuit 18 controls the internal power supply potential intVcc to be equal to the reference potential Vref.

Auxiliary internal power supply potential supplying circuit 18 is different from auxiliary internal power supply potential supplying circuit 20 in that the size of driving P channel MOS transistor 38 is larger than that of transistor 28 in auxiliary internal power supply potential supplying circuit 20, and that an ability to drive a load connected to output node 14 is larger than that of auxiliary internal power supply potential supplying circuit 20.

P channel MOS transistor 19 is connected between output node 12 and output node 14, with the control signal φ1 applied to the gate electrode.

Description will now be given of operation of internal power supply circuit 10 according to Embodiment 1.

(1) Stand-by state

Operation of internal power supply circuit 10 in a stand-by state will first be described.

In the stand-by state, since the row address strobe signal $\overline{RAS}$ is at the H level, the control signals φ1 and φ2 are both at the L level. Upon application of the control signal φ1 at the L level to the gate electrode of P channel MOS transistor 24 and the gate electrode of N channel MOS transistor 268 in differential amplifier 26, differential amplifier 26 is deactivated, and P channel MOS transistor 24 is rendered conductive. As a result, the external power supply potential extVcc is applied to the gate electrode of driving P channel MOS transistor 28 through transistor 24. Therefore, driving P channel MOS transistor 28 is rendered non-conductive.

Similarly, when the control signal φ2 at the L level is applied to the gate electrode of P channel MOS transistor 34 and the gate electrode of N channel MOS transistor 368 in differential amplifier 36, differential amplifier 36 is deactivated, and P channel MOS transistor 34 is rendered conductive. As a result, the external power supply potential extVcc is applied to the gate electrode of driving P channel MOS transistor 38 through transistor 34. Therefore, driving P channel MOS transistor 38 is rendered non-conductive.

On the other hand, primary internal power supply potential supplying circuit 22 always supplies the internal power supply potential intVcc equal to the reference potential Vref to output node 12, since differential amplifier 30 is always activated.

Since the control signal φ1 at the L level is also applied to the gate electrode of P channel MOS transistor 19, output node 12 and output node 14 are rendered conductive. Therefore, although auxiliary internal power supply potential supplying circuit 18 does not supply the internal power supply potential intVcc to output node 14, primary internal power supply potential supplying circuit 22 always supplies the internal power supply potential intVcc to output node 14 through P channel MOS transistor 19.

As described above, in the stand-by state, the internal power supply potential intVcc is supplied to output node 12, as well as to output node 14 through P channel MOS transistor 19 by one primary internal power supply potential supplying circuit 22. Therefore, as compared to the case where the internal power supply potential intVcc is independently supplied to output nodes 2 and 3 by two primary internal power supply potential supplying circuits 6 and 8 as in conventional internal power supply circuit 1 shown in FIG. 8, power consumption is substantially reduced.

In the stand-by state, auxiliary internal power supply potential supplying circuits 20 and 18 of large power consumption do not operate, and only primary internal power supply potential supplying circuit 22 of small power consumption operates. Therefore, little power is consumed. In addition, since neither the sense amplifier driving circuit nor its peripheral circuit operates in the stand-by state, current required for the sense amplifier driving circuit and its peripheral circuit in a non-active state is guaranteed only by primary internal power supply potential supplying circuit 22.

Since the sense amplifiers do not operate, a large amount of current is not consumed in the sense amplifiers, and the potential intVcc of output node 14 does not decrease substantially. Therefore, even if output node 12 and output node 14 are connected by P channel MOS transistor 19, no problem occurs.

(2) Active state

In an active state, the row address strobe signal $\overline{RAS}$ falls from the H level to the L level. In response to the falling, the control signals φ1 and φ2 rise from the L level to the H level.

When the control signal φ1 at the H level is applied to the gate electrode of P channel MOS transistor 24 and the gate electrode of N channel MOS transistor 268 in differential amplifier 26, P channel MOS transistor 24 is rendered non-conductive, and N channel MOS transistor 268 is rendered conductive. As a result, differential amplifier 26 is activated, and driving P channel MOS transistor 28 is controlled so that the potential intVcc of output node 12 becomes equal to the reference potential Vref. Therefore, the internal power supply potential intVcc is supplied to output node 12 by auxiliary internal power supply potential supplying circuit 20. At this time, the internal power supply potential intVcc is supplied to output node 12 also by primary internal power supply potential supplying circuit 22.

On the other hand, when the control signal φ2 at the H level is applied to the gate electrode of P channel MOS transistor 34 and the gate electrode of N channel MOS transistor 368 in differential amplifier 36, P channel MOS transistor 34 is rendered non-conductive, and N channel MOS transistor 368 is rendered conductive. As a result, differential amplifier 36 controls driving P channel MOS transistor 38 so that the potential intVcc of output node 14 becomes equal to the reference potential Vref. Therefore, the internal power supply potential intVcc is supplied to output node 14 by auxiliary internal power supply potential supplying circuit 18.

At this time, since the control signal φ1 at the H level is also applied to the gate electrode of P channel MOS transistor 19, P channel MOS transistor 19 is rendered nonconductive. As a result, output node 12 and output 14 are electrically disconnected.

As described above, in the active state, down converter 16 and down converter 18 can supply the internal power supply potential intVcc to output node 12 and output node 14 independently. More specifically, output node 12 and output node 14 are electrically disconnected by P channel MOS transistor 19. Therefore, even if operation of the sense amplifiers consuming a large amount of power causes the sense amplifier driving circuit to consume a large amount of current, thereby changing the potential intVcc of output node 14 substantially, the change will have no influence on output node 12.

A large amount of current is consumed in the sense amplifier driving circuit, because a number of sense amplifiers are generally provided in a DRAM, and because, when one row of a memory cell array is selected by a row decoder, data read out from memory cells of the row are all amplified by these sense amplifiers.

In the active state, the sense amplifier driving circuit and its peripheral circuit all operate. Therefore, a large amount of current is consumed. However, both auxiliary internal power supply potential supplying circuits 20 and 18 having a large driving ability operate to guarantee sufficient current required for the sense amplifier driving circuit and its peripheral circuit.

EMBODIMENT 2

Figure 2:
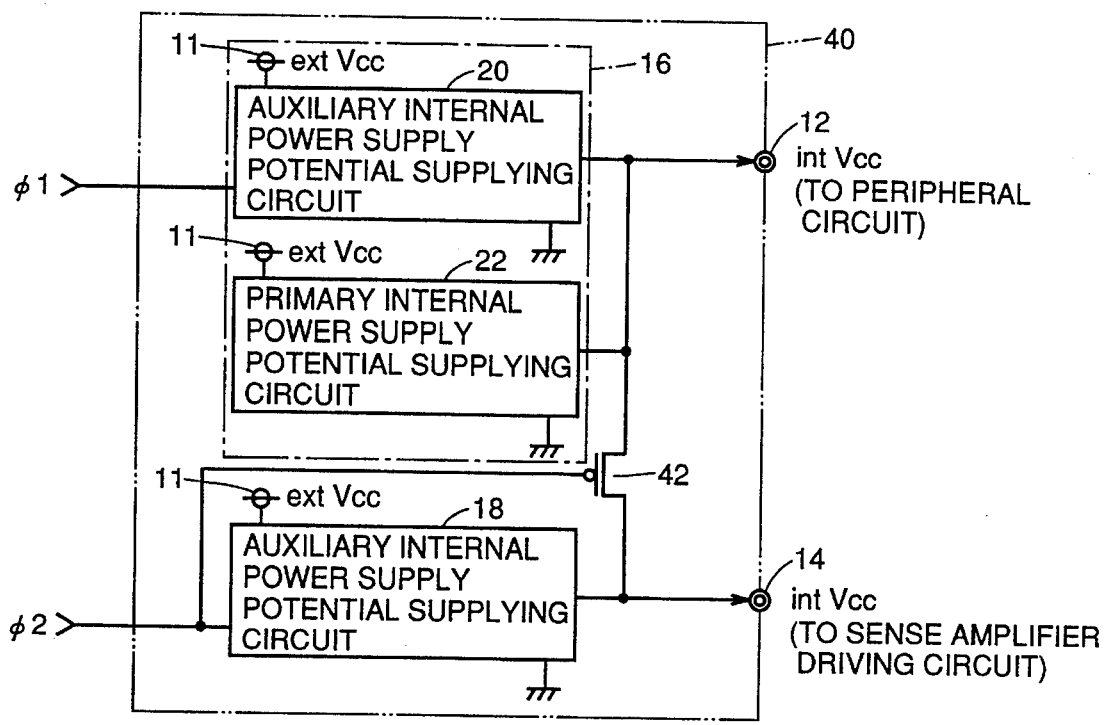
FIGS. 2 to 7 are block diagrams showing the entire configurations of internal power supply circuits according to Embodiments 2 to 7 of the present invention.

FIG. 2 is a block diagram showing the entire configuration of an internal power supply circuit according to Embodiment 2 of the present invention.

Similar to internal power supply circuit 10 according to Embodiment 1, an internal power supply circuit 40 according to Embodiment 2 is formed in a DRAM including a sense amplifier driving circuit and its peripheral circuit.

Referring to FIG. 2, internal power supply circuit 40 includes output node 12 connected to respective power supply nodes of the peripheral circuit, output node 14 connected to a power supply node of the sense amplifier driving circuit, down converter 16 for the peripheral circuit, a down converter for the sense amplifier (auxiliary internal power supply potential supplying circuit 18), and a P channel MOS transistor 42.

Similar to Embodiment 1, down converter 16 includes auxiliary internal power supply potential supplying circuit 20 activated in response to the control signal φ1, and, when activated, supplying the internal power supply potential intVcc lower than the external power supply potential extVcc to output node 12 based on the external power supply potential extVcc, and primary internal power supply potential supplying circuit 22 always supplying the internal power supply potential to output node 12 based on the external power supply potential.

The down converter (18) is configured of auxiliary internal power supply potential supplying circuit 18 activated in response to the control signal φ2, and, when activated, supplying the internal power supply potential intVcc to output node 14 based on the external power supply potential extVcc.

P channel MOS transistor 42 is connected between output node 12 and output node 14, with the control signal φ2 applied to the gate electrode. The control signals φ1 and φ2, generated in response to the internal row address strobe signal $\overline{RAS}$, rise in response to the falling of the internal row address strobe signal $\overline{RAS}$.

Embodiment 2 is different from Embodiment 1 in that the control signal φ2 (not the control signal φ1) is applied to the gate electrode of P channel MOS transistor 42 (not P channel MOS transistor 19).

Operation of internal power supply circuit 40 according to Embodiment 2 will now be described.

(1) Stand-by state

In a stand-by state, since the control signals φ1 and φ2 both at the L level are applied to auxiliary internal power supply potential supplying circuits 20 and 18, respectively, these auxiliary internal power supply potential supplying circuits 20 and 18 are not activated. On the other hand, primary internal power supply potential supplying circuit 22 is always activated. Therefore, the internal power supply potential intVcc is supplied to output node 12 by primary internal power supply potential supplying circuit 22. Since the control signal φ2 at the L level is also applied to the gate electrode of P channel MOS transistor 42, transistor 42 is rendered conductive. Therefore, the internal power supply potential intVcc generated by primary internal power supply potential supplying circuit 22 is also supplied to output node 14 through P channel MOS transistor 42.

Figure 8:
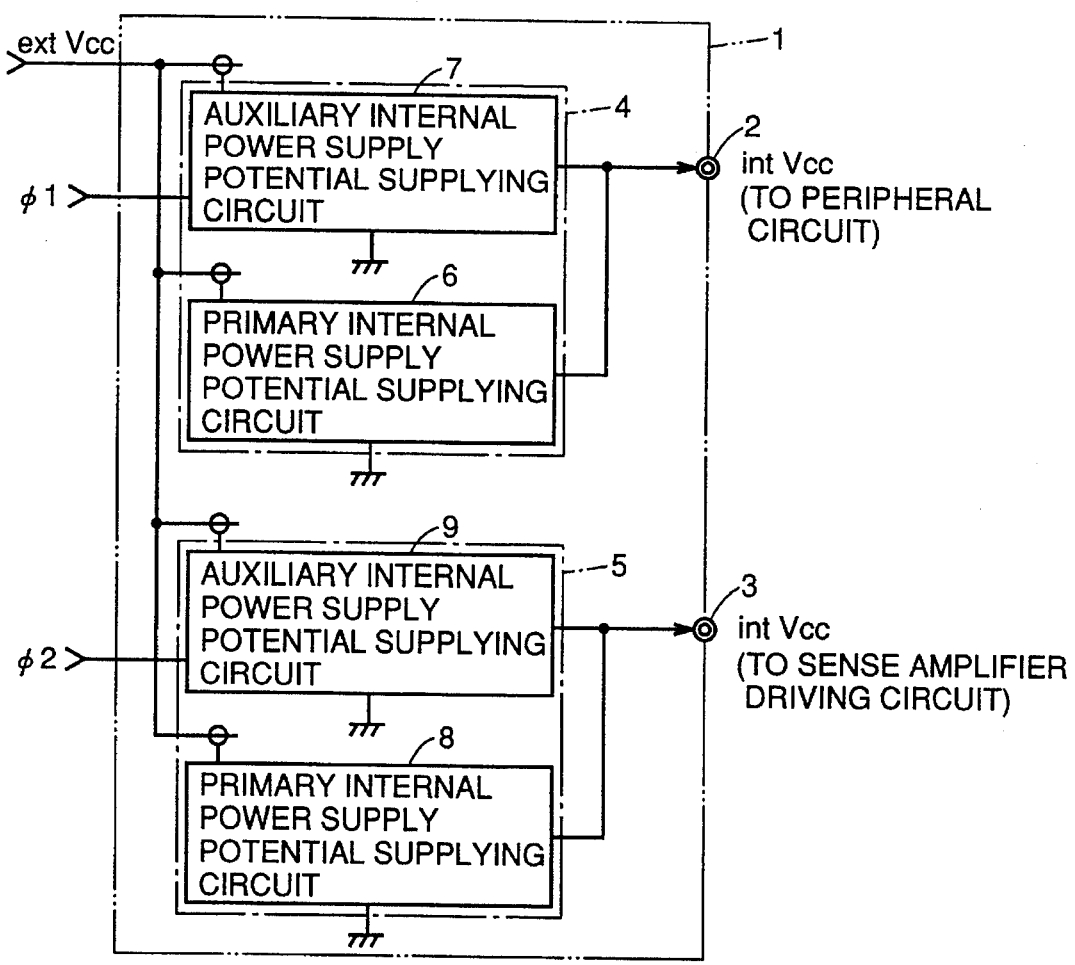
FIG. 8 is a block diagram showing the entire configuration of a conventional internal power supply circuit.

Therefore, power consumption is substantially reduced as compared to the case where the internal power supply potential intVcc is independently supplied to output nodes 2 and 3 by two primary internal power supply potential supplying circuits 6 and 8 as in conventional internal power supply circuit 1 shown in FIG. 8.

(2) Active state

In an active state, since the control signals φ1 and φ2 both at the H level are applied to auxiliary internal power supply potential supplying circuits 20 and 18, respectively, these auxiliary internal power supply potential supplying circuits 20 and 18 are both activated. Since the control signal φ2 at the L level is also applied to the gate electrode of P channel MOS transistor 42, P channel MOS transistor 42 is rendered non-conductive.

Therefore, in down converter 16, the internal power supply potential intVcc is supplied to output node 12 not only by primary internal power supply potential supplying circuit 22 but also by auxiliary internal power supply potential supplying circuit 20. In the down converter for the sense amplifier, the internal power supply potential intVcc is supplied to output node 14 by auxiliary internal power supply potential supplying circuit 18. At this time, output node 12 and output node 14 are electrically disconnected by P channel MOS transistor 42. Therefore, even if a number of sense amplifiers operate simultaneously, and a large amount of current is consumed in the sense amplifier driving circuit, a potential change at output node 14 will have no influence on output node 12.

As described above, the control signal φ2, not the control signal φ1, may be applied to the gate electrode of transistor 42 for switching between output node 12 and output node 14.

EMBODIMENT 3

Figure 3:
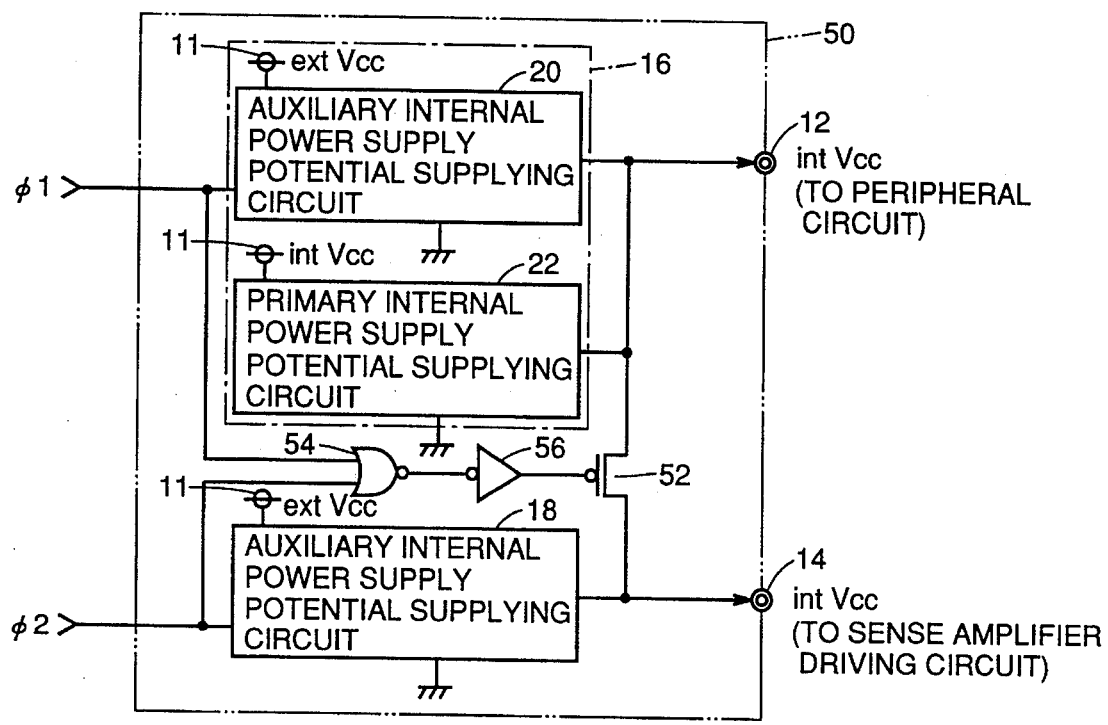

FIG. 3 is a block diagram showing the entire configuration of an internal power supply circuit according to Embodiment 3 of the present invention.

Similar to Embodiments 1 and 2, an internal power supply circuit 50 according to Embodiment 3 is formed in a DRAM including a sense amplifier driving circuit and its peripheral circuit.

Referring to FIG. 3, internal power supply circuit 50 includes output node 12 connected to respective power supply nodes of the peripheral circuit, output node 14 connected to a power supply node of the sense amplifier driving circuit, down converter 16 for the peripheral circuit, a down converter for the sense amplifier (auxiliary internal power supply potential supplying circuit 18), a P channel MOS transistor 52, an NOR gate 54, and an inverter 56.

Similar to Embodiments 1 and 2, down converter 16 includes auxiliary internal power supply potential supplying circuit 20 activated in response to the control signal $\phi1$, and, when activated, supplying the internal power supply potential intVcc to output node 12 based on the external power supply potential extVcc, and primary internal power supply potential supplying circuit 22 always activated and always supplying the internal power supply potential intVcc to output node 12 based on the external power supply potential extVcc.

The down converter (18) is configured of auxiliary internal power supply potential supplying circuit 18 activated in response to the control signal $\phi2$ and, when activated, supplying the internal power supply potential intVcc to output node 14 based on the external power supply potential extVcc.

P channel MOS transistor 52 is connected between output node 12 and output node 14, with the control signals $\phi1$ and $\phi2$ applied to the gate electrode through an OR gate (not shown) configured of NOR gate 54 and inverter 56.

Embodiment 3 is different from Embodiments 1 and 2 in that the control signals $\phi1$ and $\phi2$ are both applied to the gate electrode of P channel MOS transistor 52 through an OR gate. In Embodiments 1 and 2, the control signal $\phi1$ or $\phi2$ is directly applied to the gate electrode of the P channel MOS transistor.

Operation of internal power supply circuit 50 according to Embodiment 3 will now be described.

(1) Stand-by state

In a stand-by state, since the control signals $\phi1$ and $\phi2$ both at the L level are applied to auxiliary internal power supply potential supplying circuits 20 and 18, respectively, these auxiliary internal power supply potential supplying circuits 20 and 18 are not activated.

On the other hand, since primary internal power supply potential supplying circuit 20 is always activated, the internal power supply potential intVcc is supplied to output node 12 by primary internal power supply potential supplying circuit 22. Since the control signals $\phi1$ and $\phi2$ both at the L level are applied to the gate electrode of P channel MOS transistor 52 through NOR gate 54 and inverter 56, P channel MOS transistor 52 is rendered conductive. Therefore, the internal power supply potential intVcc generated by primary internal power supply potential supplying circuit 22 is also supplied to output node 14 through P channel MOS transistor 52.

As described above, in the stand-by state, the internal power supply potential intVcc is supplied to both output node 12 and output node 14 by one primary internal power supply potential supplying circuit 22. Therefore, power consumption is substantially reduced as compared to the case where the internal power supply potential intVcc is supplied to output node 2 and output node 3 by two primary internal power supply potential supplying circuits 6 and 8 as in conventional internal power supply circuit 1 shown in FIG. 8. In addition, since the internal power supply potential intVcc is supplied only by primary internal power supply potential supplying circuit 22 of small power consumption in the stand-by state, little power is consumed.

As in Embodiments 1 and 2, the control signal $\phi1$ or $\phi2$ may be directly applied to the gate electrode of P channel MOS transistor 19 or 42. However, as in Embodiment 3, the control signals $\phi1$ and $\phi2$ may be both applied to the gate electrode of P channel MOS transistor 52, so that output node 12 and output node 14 is electrically disconnected in response to one of the control signals $\phi1$ and $\phi2$.

EMBODIMENT 4

Figure 4:
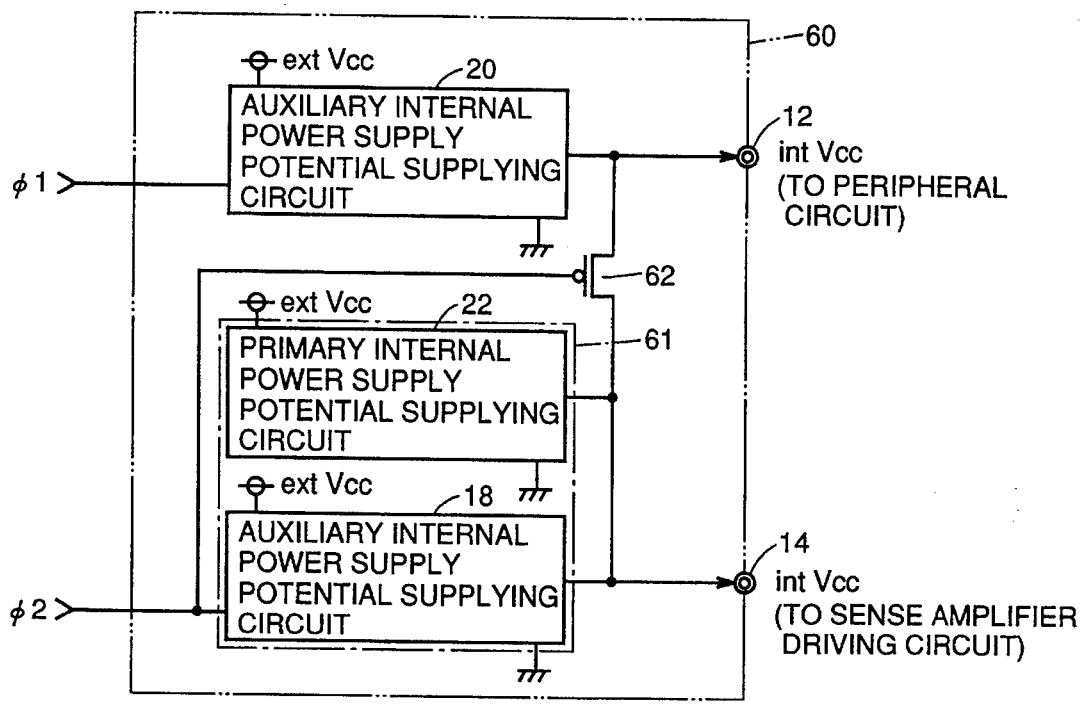

FIG. 4 is a block diagram showing the entire configuration of an internal power supply circuit 60 according to Embodiment 4.

Similar to Embodiments 1 to 3, internal power supply circuit 60 is formed in a DRAM including a sense amplifier driving circuit and its peripheral circuit.

Referring to FIG. 4, internal power supply circuit 60 includes output node 12 connected respective power supply nodes of the peripheral circuit, output node 14 connected to a power supply circuit of the sense amplifier driving circuit, a down converter for the peripheral circuit (auxiliary internal power supply potential supplying circuit 20), a down converter 61 for the sense amplifier, and a P channel MOS transistor 62.

The down converter (20) is configured of auxiliary internal power supply potential supplying circuit 20 activated in response to the control signal $\phi1$ and, when activated, supplying the internal power supply potential intVcc to output node 12 based on the external power supply potential extVcc.

Down converter 61 includes primary internal power supply potential supplying circuit 22 always activated and always supplying the internal power supply potential intVcc to output node 14 based on the external power supply potential extVcc, and auxiliary internal power supply potential supplying circuit 18 activated in response to the control signal $\phi2$ and, when activated, supplying the internal power supply potential intVcc to output node 14 based on the external power supply potential extVcc.

P channel MOS transistor 62 is connected between output node 12 and output node 14, with the control signal $\phi2$ applied to the gate electrode.

Embodiment 4 is different from Embodiment 2 in that down converter 61 for the sense amplifier includes primary internal power supply potential supplying circuit 22. In Embodiment 2, down converter 16 for the peripheral circuit includes primary internal power supply potential supplying circuit 22.

Operation of internal power supply circuit 60 according to Embodiment 4 will now be described.

(1) Stand-by state

In a stand-by state, since the control signals $\phi1$ and $\phi2$ both at the L level are applied to auxiliary internal power supply potential supplying circuits 20 and 18, these auxiliary internal power supply potential supplying circuits 20 and 18 are not activated.

On the other hand, since primary internal power supply potential supplying circuit 22 is always activated independent of the control signals $\phi1$ and $\phi2$, the internal power supply potential intVcc is supplied to output node 14 by primary internal power supply potential supplying circuit 22. Since the control signal φ2 at the L level is also applied to the gate electrode of P channel MOS transistor 62 at this time, the internal power supply potential intVcc generated by primary internal power supply potential supplying circuit 22 is also supplied to output node 12 through P channel MOS transistor 62.

As described above, in the stand-by state, the internal power supply potential intVcc is supplied to two output nodes 12 and 14 by one primary internal power supply potential supplying circuit 22. Therefore, power consumption is substantially reduced as compared to the case where the internal power supply potential intVcc is supplied to two output nodes 2 and 3 independently by two primary internal power supply potential supplying circuits 6 and 8 as in conventional internal power supply circuit 1 shown in FIG. 8. In addition, the internal power supply potential intVcc is supplied only by primary internal power supply potential supplying circuit 22 of small power consumption in the stand-by state, little power is consumed.

(2) Active state

In an active state, since the control signals φ1 and φ2 both at the H level are applied to auxiliary internal power supply potential supplying circuits 20 and 18, respectively, these auxiliary internal power supply potential supplying circuits 20 and 18 are activated. As a result, the internal power supply potential intVcc is supplied to output node 12 by auxiliary internal power supply potential supplying circuit 20, and to output node 14 not only by primary internal power supply potential supplying circuit 22 but also by auxiliary internal power supply potential supplying circuit 18.

Since the control signal φ2 at the H level is applied to the gate electrode of P channel MOS transistor 62 at this time, P channel MOS transistor 62 is rendered non-conductive. Therefore, even if a number of sense amplifiers operate simultaneously, and a large amount of current is consumed, a potential change at output node 14 will have no influence on output node 12.

As described above, in the active state, since the internal power supply potential intVcc is supplied to the sense amplifier driving circuit and its peripheral circuit independently, these circuits can both operate stably.

As in Embodiment 4, down converter 61 for the sense amplifier may include primary internal power supply potential supplying circuit 22.

EMBODIMENT 5

Figure 5:
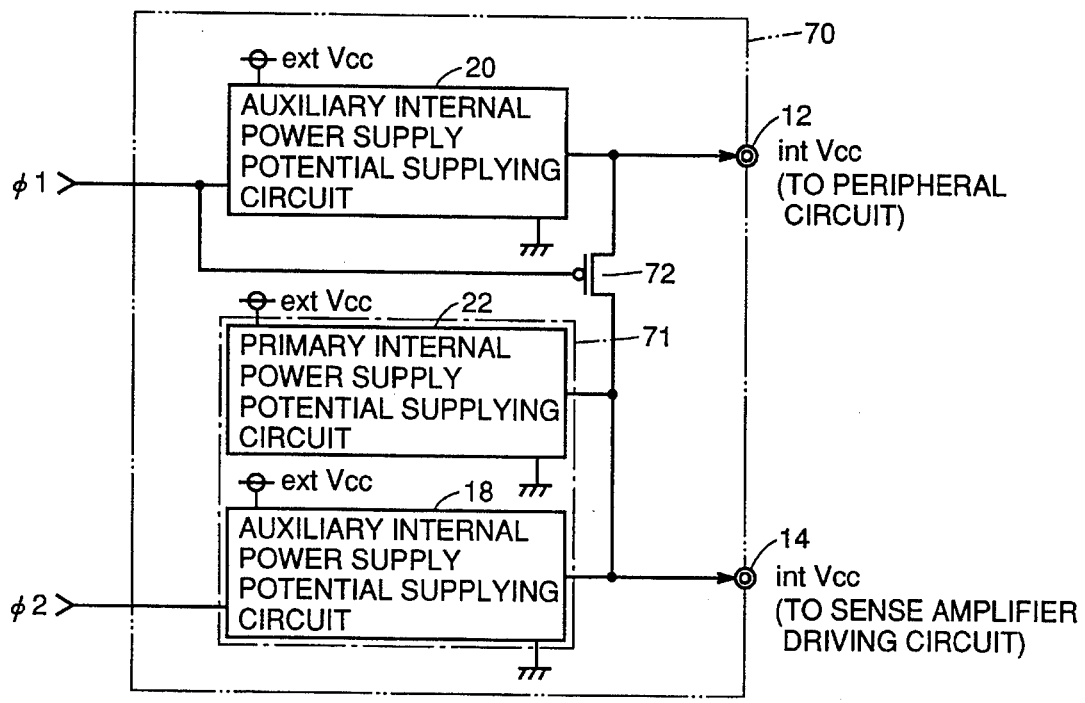

FIG. 5 is a block diagram showing the entire configuration of an internal power supply circuit according to Embodiment 5 of the present invention.

Similar to Embodiments 1 to 4, an internal power supply circuit 70 is formed in a DRAM including a sense amplifier driving circuit and its peripheral circuit.

Referring to FIG. 5, internal power supply circuit 70 includes output node 12 connected to respective power supply nodes of the peripheral circuit, output node 14 connected to a power supply node of the sense amplifier driving circuit, a down converter for the peripheral circuit (auxiliary internal power supply potential supplying circuit 20), a down converter 71 for the sense amplifier, and a P channel MOS transistor 72.

The down converter (20) is configured of auxiliary internal power supply potential supplying circuit 20 activated in response to the control signal φ1 and, when activated, supplying the internal power supply potential intVcc to output node 12 based on the external power supply potential extVcc.

Down converter 71 includes a primary internal power supply potential supplying circuit 71 always activated and always supplying the internal power supply potential intVcc to output node 14 based on the external power supply potential extVcc, and auxiliary internal power supply potential supplying circuit 18 activated in response to the control signal φ2 and, when activated, supplying the internal power supply potential intVcc to output node 14 based on the external power supply potential extVcc.

P channel MOS transistor 72 is connected between output node 12 and output node 14, with the control signal φ1 applied to the gate electrode.

Embodiment 5 is different from Embodiment 4 in that the control signal φ1 (not the control signal φ2) is applied to the gate electrode of P channel MOS transistor 72 (not P channel MOS transistor 62).

Operation of the internal power supply circuit according to Embodiment 5 will now be described.

(1) Stand-by state

In a stand-by state, since the control signals φ1 and φ2 both at the L level are applied to auxiliary internal power supply potential supplying circuits 20 and 18, respectively, these auxiliary internal power supply potential supplying circuits 20 and 18 are not activated.

Since primary internal power supply potential supplying circuit 22 is always activated independent of the control signals φ1 and φ2, the internal power supply potential intVcc is supplied to output node 14 by primary internal power supply potential supplying circuit 22. Since the control signal φ1 at the L level is also applied to the gate electrode of P channel MOS transistor 72 at this time, P channel MOS transistor 72 is rendered conductive. Therefore, the internal power supply potential intVcc generated by primary internal power supply potential supplying circuit 22 is also supplied to output node 12 through P channel MOS transistor 72.

As described above, in the stand-by state, the internal power supply potential intVcc is supplied to two output nodes 12 and 14 by one primary internal power supply potential supplying circuit 22. Therefore, power consumption is substantially reduced as compared to the case where the internal power supply potential intVcc is supplied to two output nodes 2 and 3 by two primary internal power supply potential supplying circuits 6 and 8, respectively, as in conventional internal power supply circuit 1 shown in FIG. 8. In addition, since the internal power supply potential intVcc is supplied to two output nodes 12 and 14 only by primary internal power supply potential supplying circuit 22 of small power consumption in the stand-by state, little power is consumed.

(2) Active state

In an active state, since the control signals φ1 and φ2 both at the H level are applied to auxiliary internal power supply potential supplying circuits 20 and 18, respectively, these auxiliary internal power supply potential supplying circuits 20 and 18 are both activated. As a result, the internal power supply potential intVcc is supplied to output node 12 by auxiliary internal power supply potential supplying circuit 20, as well as to output node 14 by auxiliary internal power supply potential supplying circuit 18.

Since the control signal φ1 at the H level is also applied to the gate electrode of P channel MOS transistor 72 at this time, P channel MOS transistor 72 is rendered non-conductive. Therefore, even if a number of sense amplifiers operate simultaneously, and a large amount of current is consumed, a potential change at output node 14 will have no influence on output node 12. Therefore, the sense amplifier driving circuit and its peripheral circuit can operate stably in the active state.

As in Embodiment 5, down converter 71 for the sense amplifier, not the down converter for the peripheral circuit, may include primary internal power supply potential supplying circuit 22. Further, the control signal φ1, not the control signal φ2, may be applied to the gate electrode of P channel MOS transistor 72.

EMBODIMENT 6

Figure 6:
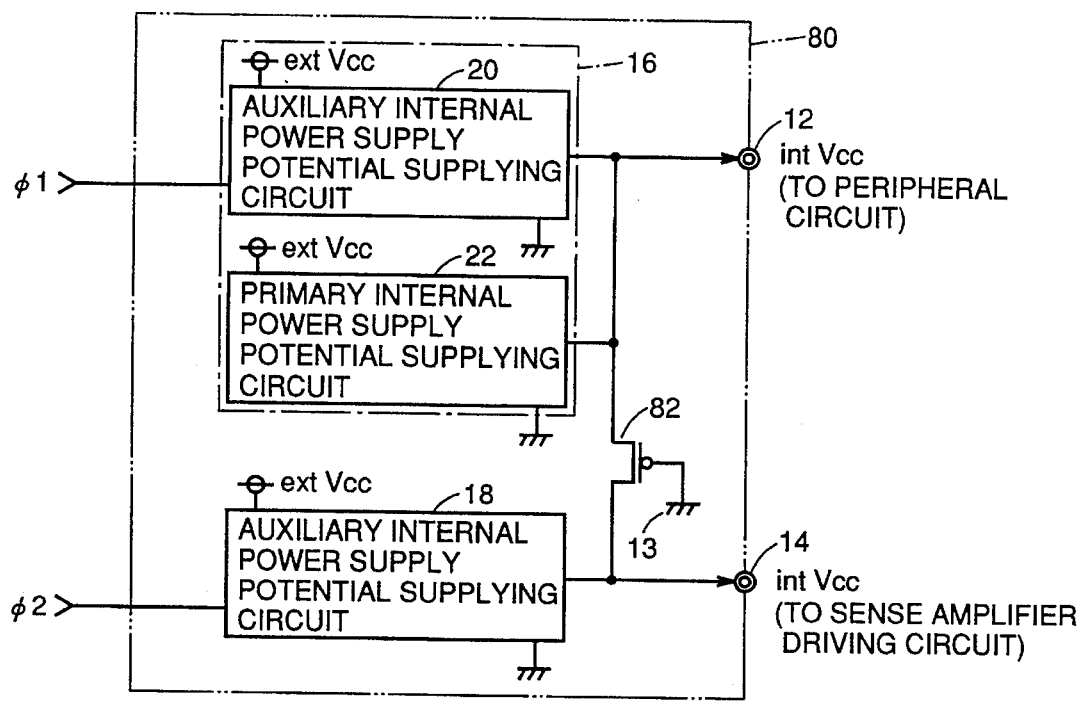

FIG. 6 is a block diagram showing the entire configuration of an internal power supply circuit according to Embodiment 6 of the present invention.

Similar to Embodiments 1 to 5, an internal power supply circuit 80 is formed in a DRAM including a sense amplifier driving circuit and its peripheral circuit.

Referring to FIG. 6, internal power supply circuit 80 includes output node 12 connected to respective power supply nodes of the peripheral circuit, output node 14 connected to a power supply node of the sense amplifier driving circuit, down converter 16 for the peripheral circuit, a down converter for the sense amplifier (auxiliary internal power supply potential supplying circuit 18), and a P channel MOS transistor 82.

Down converter 16 includes auxiliary internal power supply potential supplying circuit 20 activated in response to the control signal φ1 and, when activated, supplying the internal power supply potential intVcc to output node 12 based on the external power supply potential extVcc, and primary internal power supply potential supplying circuit 22 always activated and always supplying the internal power supply potential intVcc to output node 12 based on the external power supply potential extVcc.

The down converter (18) is configured of auxiliary internal power supply potential supplying circuit 18 activated in response to the control signal φ2 and, when activated, supplying the internal power supply potential intVcc to output node 14 based on the external power supply potential extVcc.

P channel MOS transistor 82 is connected between output node 12 and output node 14, with the gate electrode connected to a ground node 13.

Embodiment 6 is different from Embodiments 1 to 3 in that the gate electrode of P channel MOS transistor 82 is connected to ground node 13.

Operation of internal power supply circuit 80 will now be described.

(1) Stand-by state

In a stand-by state, since the control signals φ1 and φ2 both at the L level are applied to auxiliary internal power supply potential supplying circuits 20 and 18, respectively, these auxiliary internal power supply potential supplying circuits 20 and 18 are not activated.

Since primary internal power supply potential supplying circuit 22 is always activated independent of the control signals φ1 and φ2, the internal power supply potential intVcc is always supplied to output node 12 by primary internal power supply potential supplying circuit 22. At this time, P channel MOS transistor 82 is rendered conductive, because ground potential is applied to the gate electrode. Therefore, the internal power supply potential intVcc generated by primary internal power supply potential supplying circuit 22 is also supplied to output node 14 through P channel MOS transistor 82.

As described above, in the stand-by state, since the internal power supply potential intVcc is supplied to two output nodes 12 and 14 by one primary internal power supply potential supplying circuit 22, power consumption is substantially reduced as compared to the case where the internal power supply potential intVcc is supplied to two output nodes 2 and 3 by two primary internal power supply potential supplying circuits 6 and 8 as in conventional internal power supply circuit 1 shown in FIG. 8. In addition, the internal power supply potential intVcc is supplied only by primary internal power supply potential supplying circuit 22 of small power consumption in the stand-by state, little power is consumed.

(2) Active state

In an active state, since the control signals φ1 and φ2 both at the H level are applied to auxiliary internal power supply potential supplying circuits 20 and 18, respectively, these auxiliary internal power supply potential supplying circuits 20 and 18 are both activated. As a result, the internal power supply potential intVcc is supplied to output node 12 not only by primary internal power supply potential supplying circuit 22 but also by auxiliary internal power supply potential supplying circuit 20, as well as to output node 14 by auxiliary internal power supply potential supplying circuit 18.

The ground potential is applied to the gate electrode of the P channel MOS transistor. However, since no voltage is applied between the source electrode and the drain electrode, the P channel MOS transistor is substantially rendered non-conductive. Therefore, even if a number of sense amplifiers operate simultaneously, and a large amount of current is consumed, a potential change at output node 14 will have no influence on output node 12. In this sense, P channel MOS transistor 82 serves as a high pass filter (HPF) removing components of a rapid potential change at output node 14.

As described above, since the potential change at output node 14 on the sense amplifier side has no influence on output node 12 on the peripheral circuit side in the active state, the sense amplifier driving circuit and its peripheral circuit can always operate stably.

Although the control signal φ1 and/or φ2 may be applied to the gate electrode of the P channel MOS transistor connected between output node 12 and output node 14 as in Embodiments 1 to 5, the ground potential may be applied to the gate electrode as in Embodiment 6.

EMBODIMENT 7

Figure 7:
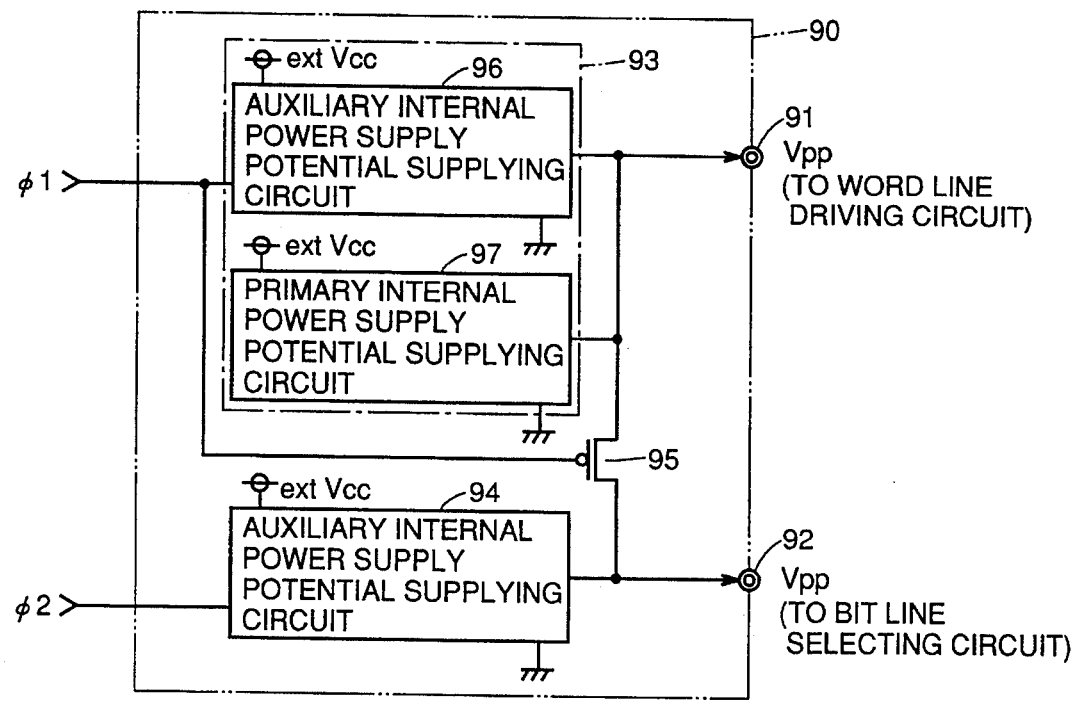

FIG. 7 is a block diagram showing the entire configuration of an internal power supply circuit 90 according to Embodiment 7 of the present invention.

Substantially similar to Embodiments 1 to 6, internal power supply circuit 90 is formed in a DRAM including a bit line selecting circuit and a word line driving circuit. In the DRAM, a so-called shared sense amplifier system is employed, in which two bit line pairs are arranged on both sides of one sense amplifier. Further, a transfer gate such as an N channel MOS transistor for selecting one of the two bit line pairs is connected between each bit line and the sense amplifier.

The voltage of a bit line increases to power supply potential (for example, 5 V) at maximum in general. Taking a threshold voltage of the transfer gate into consideration, a potential higher than power supply potential by the threshold voltage must be applied at least to the gate electrode. Therefore, the bit line selecting circuit is for selectively applying, to the gate electrode of one of the transfer gates on both ends of the sense amplifier, a bit line select signal BLI (not shown) higher than the external power supply potential extVcc at least by the threshold voltage. Therefore, it is necessary to supply to the bit line selecting circuit a boosted power supply potential Vpp higher than the external power supply potential extVcc by at least the threshold voltage.

In general, when a word line is selected by a row decoder, the potential of the word line is set to a potential higher than the external power supply potential extVcc by the threshold voltage of a transfer gate in a memory cell. This is for writing data of the external power supply potential extVcc to a capacitor of the memory cell.

Therefore, it is necessary to supply also to the word line driving circuit the boosted power supply potential Vpp higher than the external power supply potential extVcc by the threshold voltage.

Based on the above, internal power supply circuit 90 includes an output node 91 connected to a power supply node of the word line driving circuit, an output node 92 connected to a power supply node of the bit line selecting circuit, a word line up converter 93, a bit line up converter (auxiliary internal power supply potential supplying circuit 94), and a P channel MOS transistor 95.

Word line up converter 93 includes an auxiliary internal power supply potential supplying circuit 96 activated in response to the control signal $\phi 1$ and, when activated, supplying the boosted power supply potential Vpp to output node 91 based on the external power supply potential extVcc, and a primary internal power supply potential supplying circuit 97 always activated and always supplying the boosted power supply potential Vpp to output node 91 based on the external power supply potential extVcc.

The bit line up converter (94) is configured of auxiliary internal power supply potential supplying circuit 94 activated in response to the control signal $\phi 2$ and, when activated, supplying the boosted power supply potential Vpp to output node 92 based on the external power supply potential extVcc.

P channel MOS transistor 95 is connected between output node 91 and output node 92, with the control signal $\phi 1$ applied to the gate electrode.

Embodiment 7 is different from Embodiment 1 in that the internal power supply potential Vpp higher than the external power supply potential extVcc is generated, primary internal power supply potential supplying circuit 97 generates, based on the external power supply potential extVcc, the internal power supply potential Vpp higher than the same, and that both auxiliary internal power supply potential supplying circuits 96 and 94 generate, based on the external power supply potential extVcc, the internal power supply potential Vpp higher than the same.

Operation of internal power supply circuit 90 will now be described.

(1) Stand-by state

In a stand-by state, since the control signals $\phi 1$ and $\phi 2$ both at the L level are applied to auxiliary internal power supply potential supplying circuits 93 and 94, these auxiliary internal power supply potential supplying circuits 93 and 94 are not activated.

Since primary internal power supply potential supplying circuit 97 is always activated independent of the control signals $\phi 1$ and $\phi 2$, the boosted power supply potential Vpp is supplied to output node 91 by primary internal power supply potential supplying circuit 97. Since the control signal $\phi 1$ is also applied to the gate electrode of P channel MOS transistor 95 at this time, P channel MOS transistor 95 is rendered conductive. As a result, the boosted power supply potential Vpp generated by primary internal power supply potential supplying circuit 97 is also supplied to output node 92 through P channel MOS transistor 95.

As described above, in the stand-by state, the boosted power supply potential Vpp is supplied to two output nodes 91 and 92 by one internal primary power supply potential supplying circuit 97. Therefore, power consumption is substantially reduced as compared to the case where the boosted power supply potential Vpp is supplied to two output nodes by two primary internal power supply potential supplying circuits. In addition, since the boosted power supply potential Vpp is supplied only by primary internal power supply potential supplying circuit 97 of small power consumption in the stand-by state, little power is consumed.

(2) Active state

In an active state, since the control signals $\phi 1$ and $\phi 2$ both at the H level are applied to auxiliary internal power supply potential supplying circuits 96 and 94, respectively, these auxiliary internal power supply potential supplying circuits 96 and 94 are activated. As a result, the boosted power supply potential Vpp is supplied to output node 91 not only by primary internal power supply potential supplying circuit 97 but also by auxiliary internal power supply potential supplying circuit 96. In addition, the boosted power supply potential Vpp is supplied to output node 92 by auxiliary internal power supply potential supplying circuit 94.

Since the control signal $\phi 1$ at the H level is applied to the gate electrode of P channel MOS transistor 95 at this time, P channel MOS transistor 95 is rendered non-conductive. Therefore, even if a number of bit lines are selected simultaneously, and a large amount of current is consumed, a potential change at output node 92 will have no influence on output node 91. Therefore, in the active state, the bit line selecting circuit and the word line driving circuit can both operate stably.

It should be noted that internal power supply circuit 90 according to Embodiment 7 is a boosted type internal power supply circuit to which Embodiment 1 is applied.

OTHER EMBODIMENTS

P channel MOS transistors 19, 42, 52, 62, 72, 82 and 95 connected between output nodes 12, 91 and output nodes 14, 92 in Embodiments 1 to 7 may be N channel MOS transistors. In this case, it is necessary to connect an inverter immediately before the gate electrode of the N channel MOS transistor, or to make the logic level of the control signal $\phi 1$ or $\phi 2$ opposite in Embodiments 1 to 5 and 7. In Embodiment 6, it is necessary to connect the gate electrode of the N channel MOS transistor to a power supply node, and to apply the external power supply potential extVcc to the gate electrode. Further, the present invention is not limited to a semiconductor memory device such as a DRAM, but can be applied to an internal power supply circuit for supplying an internal power supply potential at least to two devices.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An internal power supply circuit generating an internal power supply potential based on an external power supply potential, comprising:

a first output node;

a second output node;

primary internal power supply potential supplying means for supplying said internal power supply potential to said first output node based on said external power supply potential;

first auxiliary internal power supply potential supplying means for selectively supplying said internal power supply potential to said first output node based on said external power supply potential;

second auxiliary internal power supply potential supplying means for supplying, when said first auxiliary internal power supply potential supplying means supplies said internal power supply potential, said internal power supply potential to said second output node based on said external power supply potential; and switching means connected between said first and second output nodes for being rendered non-conductive when said first and second auxiliary internal power supply potential supplying means supply said internal power supply potential, respectively.

2. An internal power supply circuit supplying, based on an external power supply potential, an internal power supply potential lower than said external power supply potential, comprising:

a first output node;

a second output node;

primary internal power supply potential supplying means for supplying said internal power supply potential to said first output node based on said external power supply potential;

first auxiliary internal power supply potential supplying means responsive to a first control signal for supplying said internal power supply potential to said first output node based on said external power supply potential;

second auxiliary internal power supply potential supplying means responsive to a second control signal for supplying said internal power supply potential to said second output node based on said external power supply potential; and switching means connected between said first and second output nodes and responsive to one of said first control signal, said second control signal, or said first and second control signals for being rendered non-conductive.

3. An internal power supply circuit generating, based on an external power supply potential, an internal power supply potential lower than said external power supply potential for a sense amplifier driving circuit and its peripheral circuit of a semiconductor memory device, comprising:

a first output node connected to a power supply node of said peripheral circuit;

a second output node connected to a power supply node of said sense amplifier driving circuit;

primary internal power supply potential supplying means for supplying said internal power supply potential to said first output node based on said external power supply potential;

first auxiliary internal power supply potential supplying means responsive to a first control signal for supplying said internal power supply potential to said first output node based on said external power supply potential;

second auxiliary internal power supply potential supplying means responsive to a second control signal in synchronism with said first control signal for supplying said internal power supply potential to said second output node based on said external power supply potential; and switching means connected between said first and second output nodes and responsive to one of said first control signal, said second control signal, or said first and second control signals for being rendered non-conductive.

4. The internal power supply circuit as recited in claim 3, wherein said primary internal power supply potential supplying means includes a first driving transistor connected between an external power supply node to which said external power supply potential is supplied and said first output node, and first comparing means for comparing a potential of said first output node with an externally supplied constant reference potential to render said first driving transistor conductive when the potential of said first output node is lower than said constant reference potential, and to render said first driving transistor non-conductive when the potential of said first output node is higher than said constant reference potential.

5. The internal power supply circuit as recited in claim 4, wherein said first auxiliary internal power supply potential supplying means includes a second driving transistor connected between said external power supply node and said first output node, second comparing means responsive to said first control signal for comparing the potential of said first output node with said constant reference potential to render said second driving transistor conductive when the potential of said first output node is lower than said constant reference potential, and to render said second driving transistor non-conductive when the potential of said first output node is higher than said constant reference potential, and means for rendering said second driving transistor non-conductive when said second comparing means is not activated.

6. The internal power supply circuit as recited in claim 5, wherein said second auxiliary internal power supply potential supplying means includes a third driving transistor connected between said external power supply node and said second output node, third comparing means for comparing a potential of said second output node with said constant reference potential to render said third driving transistor conductive when the potential of said second output node is lower than said constant reference potential, and to render said third driving transistor non-conductive when the potential of said second output node is higher than said constant reference potential, and means for rendering said third driving transistor non-conductive when said third comparing means is not activated.

7. The internal power supply circuit as recited in claim 3, wherein said primary internal power supply potential supplying means includes a first P channel MOS transistor having a source electrode connected to an external power supply node to which said external power supply potential is supplied, and a drain electrode connected to said first output node, and differential amplifying means for amplifying a difference between a potential of said first output node and an externally supplied constant reference potential to supply the output potential to the gate electrode of said first P channel MOS transistor.

8. The internal power supply circuit as recited in claim 7, wherein said first auxiliary internal power supply potential supplying means includes a second P channel MOS transistor having a source electrode connected to said external power supply node, and a drain electrode connected to said first output node, differential amplifying means responsive to said first control signal for amplifying a difference between the potential of said first output node and said constant reference potential to supply the output potential to the gate electrode of said second P channel MOS transistor, and a third P channel MOS transistor having a source electrode connected to said external power supply node, a drain electrode connected to the gate electrode of said second P channel MOS transistor, and a gate electrode receiving said first control signal.

9. The internal power supply circuit as recited in claim 8, wherein said second auxiliary internal power supply potential supplying means includes a fourth P channel MOS transistor having a source electrode connected to said external power supply node, and a drain electrode connected to said second output node, differential amplifying means responsive to said second control signal for amplifying a difference between a potential of said second output node and said constant reference potential to supply the output potential to the gate electrode of said fourth P channel MOS transistor, and a fifth P channel MOS transistor having a source electrode connected to said external power supply node, a drain electrode connected to the gate electrode of said fourth P channel MOS transistor, and a gate electrode receiving said second control signal.

10. The internal power supply circuit as recited in claim 3, wherein said switching means includes a logical sum circuit receiving said first and second control signals, and a selective transistor connected between said first output node and said second output node and responsive to an output signal from said logical sum circuit for being rendered non-conductive.

11. An internal power supply circuit generating, based on an external power supply potential, an internal power supply potential lower than said external power supply potential for a sense amplifier driving circuit and its peripheral circuit of a semiconductor memory device, comprising:

a first output node connected to a power supply node of said peripheral circuit;

a second output node connected to a power supply node of said sense amplifier driving circuit;

primary internal power supply potential supplying means for supplying said internal power supply potential to said first output node based on said external power supply potential;

first auxiliary internal power supply potential supplying means responsive to a first control signal for supplying said internal power supply potential to said first output node based on said external power supply potential;

second auxiliary internal power supply potential supplying means responsive to a second control signal in synchronism with said first control signal for supplying said internal power supply potential to said second output node based on said external power supply potential; and a P channel MOS transistor having one source/drain electrode connected to said first output node, the other source/drain electrode connected to said second output node, and a gate electrode receiving a ground potential.

12. An internal power supply circuit generating, based on an external power supply potential, an internal power supply potential higher than said external power supply potential, comprising:

a first output node;

a second output node;

primary internal power supply potential supplying means for supplying said internal power supply potential to said first output node based on said external power supply potential;

first auxiliary internal power supply potential supplying means responsive to a first control signal for supplying said internal power supply potential to said first output node based on said external power supply potential;

second auxiliary internal power supply potential supplying means responsive to a second control signal for supplying said internal power supply potential to said second output node based on said external power supply potential; and switching means connected between said first and second output nodes and responsive to one of said first control signal, said second control signal, or said first and second control signals for being rendered non-conductive.

13. An internal power supply circuit generating, based on an external power supply potential, an internal power supply potential higher than said external power supply potential for a bit line selecting circuit and a word line driving circuit of a semiconductor memory device, comprising:

a first output node connected to a power supply node of said word line driving circuit;

a second output node connected to a power supply node of said bit line selecting circuit;

primary internal power supply potential supplying means for supplying said internal power supply potential to said first output node based on said external power supply potential;

first auxiliary internal power supply potential supplying means responsive to a first control signal for supplying said internal power supply potential to said first output node based on said external power supply potential;

second auxiliary internal power supply potential supply-
ing means responsive to a second control signal in synchronism with said first control signal for supplying said internal power supply potential to said second output node based on said external power supply potential; and switching means connected between said first and second output nodes and responsive to one of said first control signal, said second control signal, or said first and second control signals for being rendered non-conductive.

14. An internal power supply circuit generating an internal power supply potential based on an external power supply potential, comprising:

a first output node;

a second output node;

primary internal power supply potential supplying means for supplying said internal power supply potential to said first output node based on said external power supply potential;

first auxiliary internal power supply potential supplying means for selectively supplying said internal power supply potential to said first output node based on said external power supply potential;

second auxiliary internal power supply potential supplying means for supplying, when said first auxiliary internal power supply potential supplying means supplies said internal power supply potential, said internal power supply potential to said second output node based on said external power supply potential; and switching means connected between said first and second output nodes for being rendered conductive when neither said first nor second auxiliary internal power supply potential supplying means supplies said internal power supply potential.

* * * * *